US011101744B2

(12) United States Patent
Spruill

(10) Patent No.: US 11,101,744 B2
(45) Date of Patent: Aug. 24, 2021

(54) CAPACITIVE ENGINE FEATURING AN EXTRINSIC SEMICONDUCTOR

(71) Applicant: Michael Junior Spruill, Washington, NC (US)

(72) Inventor: Michael Junior Spruill, Washington, NC (US)

(*) Notice: Subject to any disclaimer, the term of this patent is extended or adjusted under 35 U.S.C. 154(b) by 61 days.

(21) Appl. No.: 16/729,227

(22) Filed: Dec. 27, 2019

(65) Prior Publication Data

US 2021/0203252 A1 Jul. 1, 2021

(51) Int. Cl.
*H02N 1/00* (2006.01)
*H01L 29/872* (2006.01)
*H01L 31/0352* (2006.01)
*H02N 1/08* (2006.01)

(52) U.S. Cl.
CPC ........... *H02N 1/002* (2013.01); *H01L 29/872* (2013.01); *H02N 1/08* (2013.01); *H01L 31/035281* (2013.01)

(58) Field of Classification Search
CPC .................................. H02N 1/002; H02N 1/08
See application file for complete search history.

(56) References Cited

U.S. PATENT DOCUMENTS

| | | | | |
|---|---|---|---|---|
| 2003/0141509 A1* | 7/2003 | Udagawa | ................ | H01L 33/30 257/79 |
| 2004/0256612 A1* | 12/2004 | Mohseni | ................ | H01L 29/127 257/14 |
| 2007/0057687 A1* | 3/2007 | Kadyshevitch | ...... | G01R 31/307 324/754.22 |
| 2014/0175372 A1* | 6/2014 | berg | .................... | H01L 31/1852 257/9 |
| 2015/0155395 A1* | 6/2015 | Suh | ........................ | H01L 29/872 257/26 |
| 2020/0028000 A1* | 1/2020 | Wang | .................... | H01L 31/075 |

* cited by examiner

*Primary Examiner* — Michael C Zarroli
(74) *Attorney, Agent, or Firm* — Carson Patents®; Gregory D. Carson

(57) ABSTRACT

The capacitive engine is an asymmetrical capacitor which produces a net non-zero electrostatic force when a voltage difference is applied between the two conductor-semiconductor contacts of an incompletely spherical extrinsic semiconductor shell. At least one Schottky barrier is made from one of the conductor-semiconductor contacts at either of the extrinsic semiconductor's inner or outer radius and is always in reverse bias. Since the Schottky barrier is always in reverse bias, the reverse biased Schottky barrier becomes an electronic capacitor mimicking the shape of the incompletely spherical shell of the extrinsic semiconductor. A net non-zero electrostatic force is thereby produced because the inner and outer radial surface areas of the electronic capacitor have a non-zero difference and this difference is multiplied by the relative electrical permittivity of the incompletely spherical extrinsic semiconductor shell when calculating the net electrostatic force of the capacitive engine.

5 Claims, 4 Drawing Sheets

CAPACITIVE ENGINE FEATURING AN EXTRINSIC SEMICONDUCTOR

CROSS-REFERENCE TO RELATED APPLICATIONS

Not applicable.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY AN INVENTOR OR A JOINT INVENTOR

Not applicable.

BACKGROUND OF THE INVENTION

The field of the invention is class H02N 1/00: Electrostatic generators or motors using a solid moving electrostatic charge carrier. The invention is an electrostatic propulsion device.

Prior art of electrostatic propulsion devices consists of asymmetrical capacitors. The problems with prior art are manifold. First, the prior art devices need many kiloVolts of voltage to be able to show appreciable force. Second, even when the voltage is tens of kiloVolts, prior art devices only push a few grams of force. Last, prior art devices are made of easily destructible materials such as foil and very small diameter wooden dowels.

Prior art devices are respectively constructed in each own's specific geometric configurations and all used the surrounding air as a dielectric between their electrical terminals. Asymmetrical capacitors produce a net non-zero electrostatic force by making one of the electrical terminals of the asymmetrical capacitor a different size, a different shape, or a different size and shape from the remaining electrical terminal or by arranging the electrical terminals in a specific geometrical shape so as to produce a net imbalance in originally balanced electrostatic forces.

BRIEF SUMMARY OF THE INVENTION

The invention is an electrostatic propulsion device in the form of an original type of asymmetrical capacitor. Usually, an asymmetrical capacitor produces a net non-zero electrostatic force by making one of the electrical terminals of the asymmetrical capacitor a different size, a different shape, or a different size and shape from the remaining electrical terminal or by arranging the electrical terminals in a certain geometric arrangement to produce an imbalance in usually net balanced electrostatic forces to result in the net non-zero electrostatic force. Traditionally, asymmetrical capacitors require air as their internal medium. On the other hand, the subjected invention depends on an extrinsic semiconductor possessing inner and outer intimate conductor-semiconductor contacts as the material between its two electrical terminals where the extrinsic semiconductor is in the shape of an incompletely spherical shell with the inner and outer intimate conductor-semiconductor contacts on the inner and outer radii, respectively, of the incompletely spherical extrinsic semiconductor shell where at least one of the intimate contacts is a Schottky barrier. When a voltage difference is applied to the electrical terminals which makes a Schottky barrier reverse biased, a charge separation forms between the extrinsic semiconductor and the reverse biased Schottky barrier. This charge separation forms an electronic capacitor where this separation is in the same shape as the incompletely spherical semiconductor shell. Because this charge separation or formed electronic capacitor is in the shape of an incompletely spherical shell and, therefore, possesses two different radii and surface areas, a non-zero electrostatic force difference occurs which moves the invention and anything attached to the invention with the same net non-zero electrostatic force. This net non-zero electrostatic force is normal to the exact center of the surface of the incompletely spherical extrinsic semiconductor shell.

DETAILED DESCRIPTION OF THE INVENTION

Figure 1:
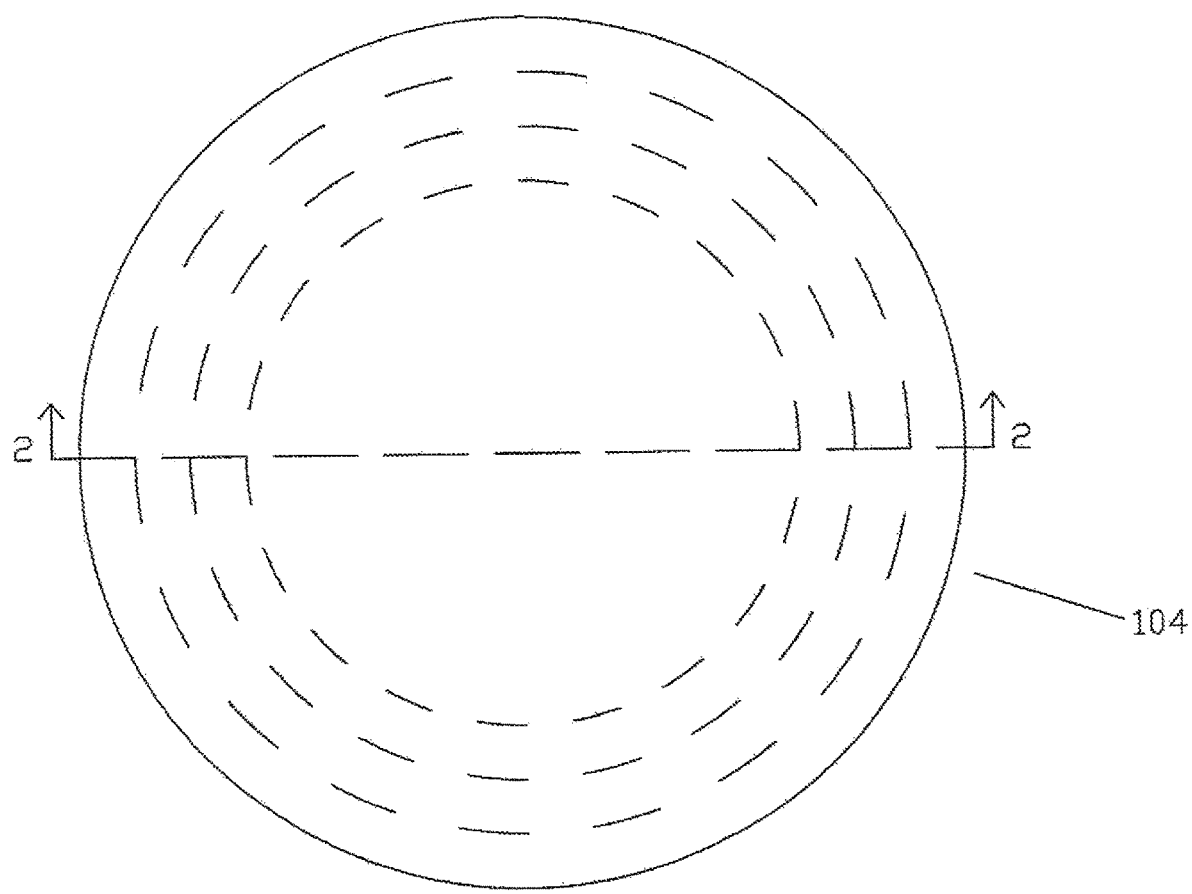
FIG. 1 is the top view of an embodiment of the capacitive engine.
Figure 2:
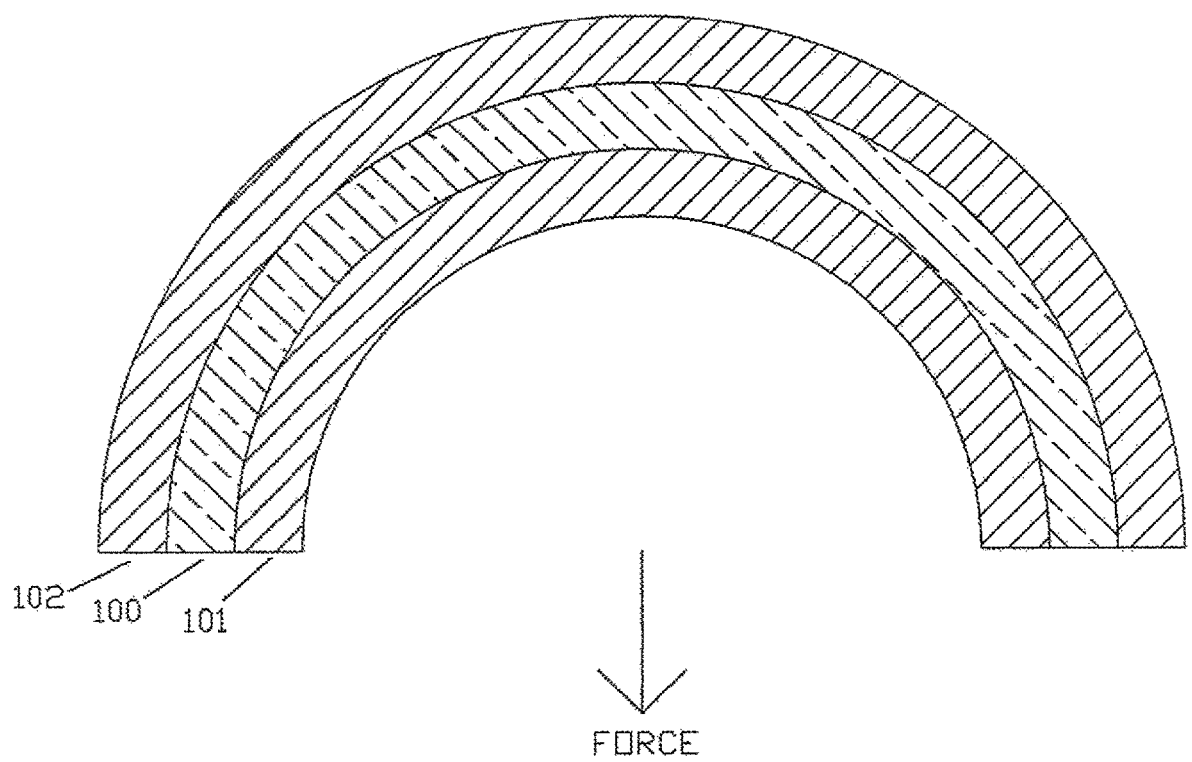
FIG. 2 is the cross-sectional view of the capacitive engine as taken from FIG. 1.
Figure 3:
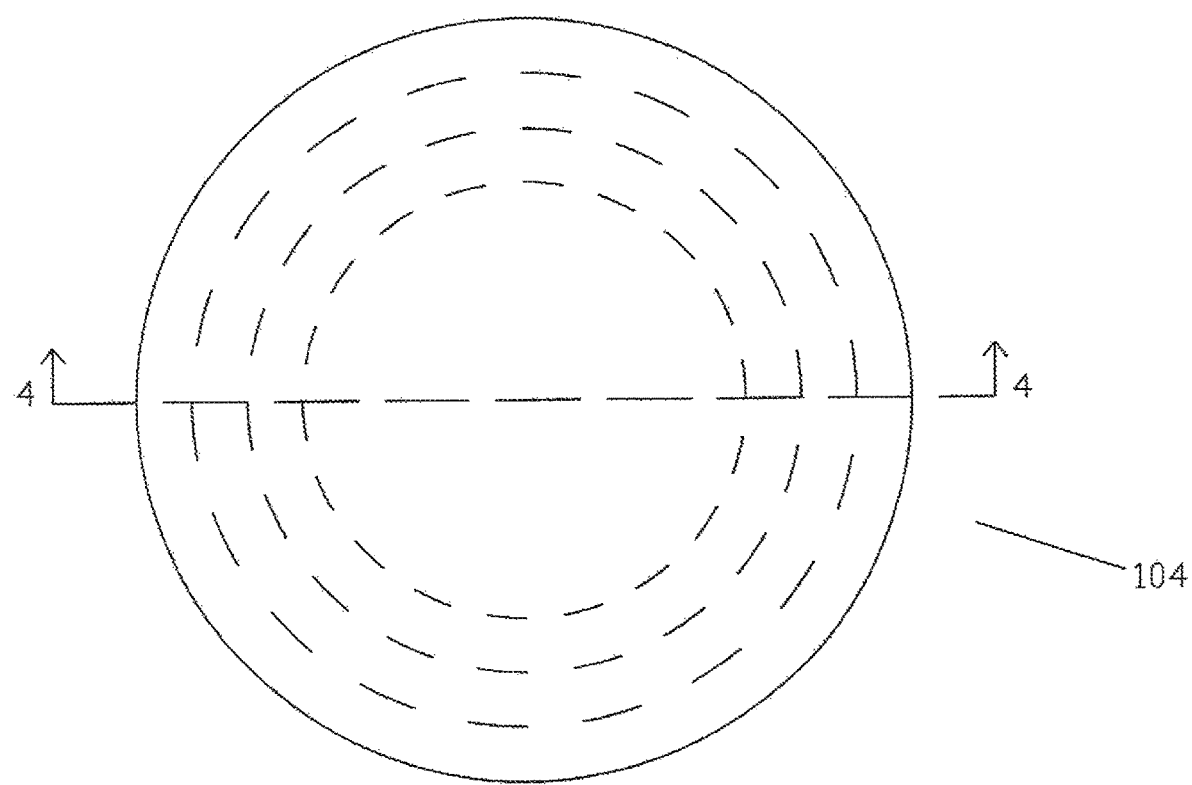
FIG. 3 is the top view of an alternate embodiment of the capacitive engine.
Figure 4:
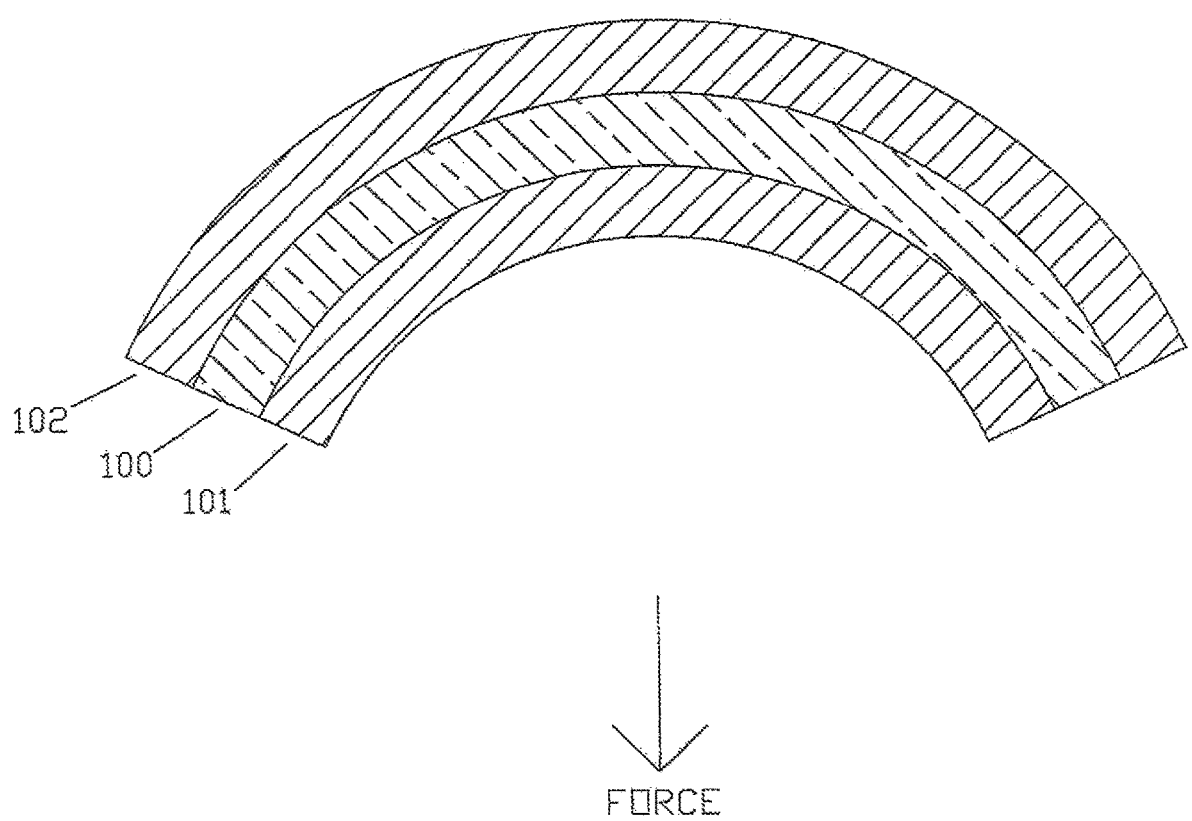
FIG. 4 is the cross-sectional view of the capacitive engine as taken from FIG. 3.

The invention is an electrostatic propulsion device in the form of an asymmetrical capacitor. An asymmetrical capacitor produces a net non-zero electrostatic force in one direction by making one of the electrical terminals of the asymmetrical capacitor either a different size, a different shape, or a different size and shape from the remaining electrical terminal or by arranging the electrical terminals in a specific geometric pattern to induce a net imbalance in the originally balanced electrostatic forces. The material between the said electrical terminals, the shape and size of the electrical terminals and the voltage difference between the electrical terminals and the geometrical arrangement of the electrical terminals all determine the magnitude of the net electrostatic force exhibited and exerted by an asymmetrical capacitor.

The subjected invention named the capacitive engine (104) focuses on the composition, size, and shape of the materials located between its electrical terminals. The capacitive engine (104) is an extrinsic semiconductor (100) in the shape of an incompletely spherical shell fused with two conducting contacts. This engine is usually located between two electrical terminals. Located at the first electrical terminal is the inner radial conductor (101) which forms an intimate conductor-semiconductor contact with the extrinsic semiconductor (100) on the inner radius of the extrinsic semiconductor (100). Located at the second electrical terminal is the outer radial conductor (102) which also forms an intimate conductor-semiconductor contact with the extrinsic semiconductor (100) but, this time, on the outer radius of the extrinsic semiconductor (100). The base of the incompletely spherical shell shaped extrinsic semiconductor (100) is not in any intimate contact with any conductor. The inner radial conductor (101) and the outer radial conductor (102) are made from any conductive material, usually metallic, which forms the conductor-semiconductor contact with the pre-shaped extrinsic semiconductor (100) by either pouring the melted form of the conductive material onto the inner and outer radii of the extrinsic semiconductor (100) and cooling the conductive material or depositing the vapor form of the conductive material onto the extrinsic semiconductor (100) and cooling it. In either case, only a thin layer of conductive material is necessary to form the inner radial conductor (101) and the outer radial conductor (102).

At least one of the conductor-semiconductor contacts must be a Schottky barrier and the remaining conductor-semiconductor contact can be either an ohmic contact or a Schottky barrier. Because a Schottky barrier is formed by the extrinsic semiconductor (100) and one of the radial conductors (101, 102), a pn junction is formed if the extrinsic semiconductor (100) was doped with acceptor atoms to make the extrinsic semiconductor (100) p-type or an np junction is formed if the extrinsic semiconductor (100) was doped with donor atoms to make the extrinsic semiconductor (100) n-type. This junction is important because when a voltage difference between the inner radial conductor (101) and the outer radial conductor (102) makes the Schottky barrier reverse biased, an electronic capacitor is formed at the Schottky barrier between the extrinsic semiconductor (100) and the radial conductor of the Schottky barrier because this Schottky barrier experiences a charge separation. The formed electronic capacitor has the same incompletely spherical shape of the Schottky barriers but due to the capacitor being electronic, the inner and outer radii of the electronic capacitor's incompletely spherical shell shape can change without changing the physical characteristics of the capacitive engine (104) by just changing the voltage difference between the two conductor-semiconductor contacts. As the voltage increases, the Schottky barrier experiencing reverse breakdown will extend the outside radius of the electronic capacitor. This means force can be changed by voltage and radius.

The other important feature of the reverse biased Schottky barrier is that now a maximum voltage can be designed for each capacitive engine (104) because the reverse biased Schottky barrier will experience reverse breakdown when a certain voltage is achieved. This voltage is the breakdown voltage and is the maximum voltage that will cause the capacitive engine (104) to exert and exhibit a net non-zero force. The maximum voltage is also the voltage which will cause the capacitive engine (104) to exert and exhibit its net maximum force. It is at the breakdown voltage that the capacitive engine (104) stops becoming an asymmetrical capacitor and becomes a low-resistance resistor.

The capacitive engine (104) produces an appreciable net non-zero force because it becomes an asymmetrical electronic capacitor. Becoming an asymmetrical electronic capacitor allows the capacitive engine (104) to: multiply the normal amount of generated net force by a factor that is equal to the extrinsic semiconductor's (100) relative electrical permittivity; to multiply the normal amount of generated net force by a factor that is equal to the inverse proportion of the difference of the inner and outer radii of the asymmetrical electronic capacitor; and to multiply the normal amount of generated net force by a factor that is equal to the sum of the inner and outer radii of the electronic capacitor. Therefore, the larger the extrinsic semiconductor's (100) relative electrical permittivity, the larger is the generated force; the smaller the difference between the inner and outer radii of the electronic capacitor, the larger is the generated force; and the larger the outer radius of the electronic capacitor, the larger is the generated force.

The equation determining the force, F, exhibited and exerted by the capacitive engine (104) is: $F=\Sigma \frac{1}{2}\int \varepsilon E^2 dA = \frac{1}{2}\int \varepsilon E^2 dA_a + \frac{1}{2}\int \varepsilon E^2 dA_b$ where $\varepsilon$ is the absolute permittivity of the extrinsic semiconductor (100), E is the electric field intensity between the inner and outer edges of the electronic capacitor, $dA_a$ is the differential surface area of the inner edge of the electronic capacitor and $dA_b$ is the differential surface area of the outer edge of the electronic capacitor. The capacitive engine (104) is usually designed for a maximum force which is the capacitive engine's (104) ultimate limitation. The equation for maximum force, $F_{MAX}$, is $F_{MAX}=\Sigma \frac{1}{2}\int \varepsilon E_c^2 dA = \frac{1}{2}\int \varepsilon E_c^2 + \frac{1}{2}\int \varepsilon E_c^2 dA_b$ where $E_C$ is the critical electric field intensity which will induce reverse breakdown.

For the capacitive engine (104), $E_C$ is found from the equation for the breakdown voltage of an extrinsic semiconductor using the radii at the maximum edges of the electronic capacitor as the limits of integration. The equation for breakdown voltage, $V_B$, in the incompletely spherical extrinsic semiconductor shell is $V_B=-\frac{1}{2}\int_{R_b}^{R_a} E_C dR$ where $R_a$ and $R_b$ are the inner and outer edges, respectively, of the electronic capacitor. The critical electric field intensity, $E_C$, is then $$E_C = \frac{2V_B}{R_b - R_a}\vec{R}.$$

The differential surface area, $dA_n$, in the maximum force equation is found from $dA_n = R_n^2 \sin\theta d\theta d\phi \vec{R} = R_n^2 \sin^2\theta d\theta d\phi \vec{r} + R_n^2 \sin\theta \cos\theta d\theta d\phi \vec{z}$ for each maximum edge ($R_a$, $R_b$) of the electronic capacitor.

When the inner radial conductor (101) makes a Schottky barrier with the p-type extrinsic semiconductor (100) and the inner radial conductor (101) possesses a larger positive voltage than the outer radial conductor (102) or when the inner radial conductor (101) makes a Schottky barrier with the n-type extrinsic semiconductor (100) and the outer radial conductor (102) possesses a larger positive voltage than the inner radial conductor (101), that Schottky barrier is in reverse bias and the maximum force equation in the $\vec{z}$ direction is $$F_{MAX} = \frac{1}{2}\int_0^{2\pi}\int_0^\theta \varepsilon \left[\frac{2V_B}{R_B - R_I}\right]^2 (R_I^2 - R_B^2) \sin\theta \cos\theta \, d\theta d\phi = 2\pi\varepsilon V_B^2 \frac{R_I + R_B}{R_I - R_B}\sin^2\theta.$$

$R_a=R_I$ is the radius of the inner radial conductor (101) and $R_b=R_B$ is the maximum outer edge of the electronic capacitor at breakdown voltage. Theta ($\theta$) indicates the angle the symmetric bases of the extrinsic semiconductor (100) makes with the vertical.

When the outer radial conductor (102) makes a Schottky barrier with the n-type extrinsic semiconductor (100) and the inner radial conductor (101) possesses a larger positive voltage than the outer radial conductor (102) or when the outer radial conductor (102) makes a Schottky barrier with the p-type extrinsic semiconductor (100) and the outer radial conductor (102) possesses a larger positive voltage than the inner radial conductor (101), that Schottky barrier is in reverse bias and the maximum force equation in the $\vec{z}$ direction is $$F_{MAX} = \frac{1}{2}\int_0^{2\pi}\int_0^{\theta}\varepsilon\left[\frac{2V_B}{R_O - R_A}\right]^2 (R_A^2 - R_O^2)\sin\theta\cos\theta\, d\theta d\phi =$$

$$2\pi\varepsilon V_B^2 \frac{R_A + R_O}{R_A - R_O}\sin^2\theta.$$

$R_a = R_A$ is the maximum inner edge of the electronic capacitor at breakdown voltage and $R_b = R_O$ is the radius of the outer radial conductor (102). Theta (θ) indicates the angle the symmetric bases of the extrinsic semiconductor (100) makes with the vertical.

To find the exact amount of dopant to make the intrinsic (pure) semiconductor into the extrinsic (impure) semiconductor required, either of the following equations is used:

$$p_{po} = \frac{\varepsilon E_C^2}{2qV_B} = \frac{4\varepsilon V_B}{2q(R_b - R_a)^2} \text{ or } n_{no} = \frac{\varepsilon E_C^2}{2qV_B} = \frac{4\varepsilon V_B}{2q(R_b - R_a)^2}$$

where $p_{po}$ is the acceptor dopant concentration to make the extrinsic semiconductor (100) a p-type and $n_{no}$ is the donor dopant concentration to make the extrinsic semiconductor (100) an n-type. The electrical charge, q, is equal to $1.6 \times 10^{-19}$ Coulombs.

The current flowing through the capacitive engine (104) is constant while the capacitive engine (104) is not in reverse breakdown. The current density is found from one of the following equations:

$$J_p = A_p^* T^2 e^{-\frac{q}{kT}\phi_{Bp}} \text{ or } J_n = A_n^* T^2 e^{-\frac{q}{kT}\phi_{Bn}}$$

where $J_p$ is the current density of the p-type extrinsic semiconductor (100), $A_p^*$ is the effective Richardson constant for the p-type extrinsic semiconductor (100), $$\phi_{Bp} = \frac{E_g}{q} - (\phi_m - \chi)$$

is the barrier height for a p-type Schottky barrier where $E_g$ is the extrinsic semiconductor (100) bandgap, $\phi_m$ is the work function of the conductor of the radial conductor (101, 102) with which the reverse-biased Schottky barrier is created, and x is the electron affinity of the extrinsic semiconductor (100), $J_n$ is the current density of the n-type extrinsic semiconductor (100), $A_n^*$ is the effective Richardson constant for the n-type extrinsic semiconductor (100), and $\phi_{Bn} = \phi_m \chi$ is the barrier height for an n-type Schottky barrier. The current is then found from either $I_{ppo} = J_p\int_0^{2\pi}\int_0^{\theta}R_I^2 \sin\theta d\theta d\phi = 2\pi R_I^2 J_p(1-\cos\theta)$ where $I_{ppo}$ is the current flowing through a p-type extrinsic semiconductor (100) or $I_{nno} = J_n\int_0^{2\pi}\int_0^{\theta}R_o^2 \sin\theta d\theta d\phi = 2\pi R_o^2 J_n(1-\cos\theta)$ where $I_{nno}$ is the current flowing through an n-type extrinsic semiconductor (100). Theta (θ) indicates the angle the symmetric bases of the extrinsic semiconductor (100) makes with the vertical.

The maximum power draw, $P_{MAX}$, of the capacitive engine (104) is found from the equation $P_{MAX} = I_{ppo}V_B$ for a capacitive engine (104) with a p-type extrinsic semiconductor (100) or $P_{MAX} = I_{nno}V_B$ for a capacitive engine (104) with an n-type extrinsic semiconductor (100).

By inspecting the force equations, it is seen that the force will always be directed in the direction of the inner radial conductor (101). Reversing voltage polarity will not change the direction of net force but it may change the magnitude of net force as different radii are now the new edges of the electronic capacitor. The reason for the negative $\vec{z}$ directed net force is that the normal to the surface area of the outer edge of the electronic capacitor is in the negative $\vec{z}$ direction because the electric field is on its inner edge while the normal to the surface area of the inner edge of the electronic capacitor is in the positive $\vec{z}$ direction because the electric field is on its outer edge. Because the surface area of the outer edge of the electronic capacitor is larger than that of the inner edge of the electronic capacitor, the sum of the normal of the two areas produces a net force in the negative $\vec{z}$ direction or, in other words, in the direction of the inner radial conductor (101). Also, from inspection, it is seen that the closer that the symmetrical base angle in the θ direction is to $$\frac{\pi}{2}$$

radians, the closer the net force of the capacitive engine (104) comes to its maximum. Likewise, the closer the symmetrical base angle in the θ direction is to zero radians or Pi radians, the closer the net force of the capacitive engine (104) comes to zero Newtons. The best mode of the capacitive engine (104) is when the symmetrical base angle in the θ direction is $$\frac{\pi}{2}$$

radians.

SEQUENCE LISTING

Not applicable.

I claim:
1. An asymmetrical capacitor (104) comprising;
an incomplete portion of a spherical extrinsic semiconductor shell (100), an inner radial conductor (101), and an outer radial conductor (102),
where each of said incomplete portion of the spherical extrinsic semiconductor shell's inner and outer radii makes a conductor-semiconductor contact with the inner radial conductor (101) and
the outer radial conductor (102) respectively,
where at least one of the conductor-semiconductor contacts is a Schottky barrier in use
whereby the conductors of said conductor-semiconductor contacts exert a net non-zero force whenever there is a voltage difference between the said two conductor-semiconductor contacts placing said Schottky barrier in reverse bias.

2. The asymmetrical capacitor (104) according to claim 1 wherein the extrinsic semiconductor shell has a base not in any intimate contact with any conductor.

3. The asymmetrical capacitor (104) according to claim 1 wherein the inner radial conductor (101) and the outer radial conductor (102) are made of a conductive material that is metallic.

4. A method of making the asymmetrical capacitor (104) according to claim 3 including pouring a melted layer of the conductive material that is metallic onto the inner and outer radii of the incomplete portion of the extrinsic semiconductor shell (100) and cooling the conductive material to form the inner radial conductor (101) and the outer radial conductor (102).

5. A method of making the asymmetrical capacitor (104) according to claim 3 including depositing a vapor layer of the conductive material that is metallic onto the incomplete portion of the spherical extrinsic semiconductor shell (100) and cooling the conductive material to form the inner radial conductor (101) and the outer radial conductor (102).

* * * * *